United States Patent [19]
French et al.

[11] Patent Number: 6,140,874
[45] Date of Patent: Oct. 31, 2000

[54] AMPLIFICATION SYSTEM HAVING MASK DETECTION AND BIAS COMPENSATION

[75] Inventors: Gregory French, Foothill Ranch; Charles R. Gentzler, Thousand Oaks; Richard D. Posner, Woodland Hills; Do B. Shin, Laguna Hills; Bill Vassilakis, Anaheim Hills, all of Calif.

[73] Assignee: Powerwave Technologies, Inc., Irvine, Calif.

[21] Appl. No.: 09/174,691

[22] Filed: Oct. 19, 1998

[51] Int. Cl.[7] .................................................. H03F 1/26
[52] U.S. Cl. ........................... 330/149; 330/151; 327/359
[58] Field of Search .................................. 330/149, 136, 330/151; 327/359; 375/296, 297; 455/126

[56] References Cited

U.S. PATENT DOCUMENTS

| | | | |
|---|---|---|---|
| 5,130,663 | 7/1992 | Tattersall, Jr. ............................ | 330/52 |
| 5,455,538 | 10/1995 | Kobayashi et al. . | |
| 5,485,120 | 1/1996 | Anvari ..................................... | 330/151 |
| 5,808,512 | 9/1998 | Bainvoll et al. ........................ | 330/151 |
| 5,912,586 | 6/1999 | Mitzlaff ................................... | 330/149 |
| 5,923,214 | 7/1999 | Mitzlaff ................................... | 330/52 |

FOREIGN PATENT DOCUMENTS

| | | |
|---|---|---|
| WO 97/08822 | 3/1997 | WIPO . |
| WO 97/37427 | 10/1997 | WIPO . |

OTHER PUBLICATIONS

European Search Report.

*Primary Examiner*—Robert Pascal
*Assistant Examiner*—Henry Choe
*Attorney, Agent, or Firm*—Fish & Richardson P.C.

[57] ABSTRACT

A method and apparatus for reducing out-of-band frequency components of an RF signal having a carrier frequency which is not known in advance employ a control signal to vary adjustable bias parameters of the circuit. In particular embodiments, the RF signal is generated from a MOSFET power amplifier, which introduces distortion components into its output signal. Bias parameters of the MOSFET amplifier can be varied to reduce out-of-band frequency components, that is, out-of-band distortion. In addition, other elements of the network can be controlled by varying bias parameters, for example, a predistorter.

14 Claims, 17 Drawing Sheets

AMPLIFICATION SYSTEM HAVING MASK DETECTION AND BIAS COMPENSATION

BACKGROUND OF THE INVENTION

This invention relates generally to amplification systems and more particularly to methods and apparatus for reducing distortion in amplifiers used in such systems.

As is known in the art, amplifiers have a wide variety of applications. Amplifiers can be biased to operate in one of a number of so-called Classes. When biased to operate in Class A, the amplifier provides a linear relationship between input voltage and output voltage. While operation in Class A has a wide range of applications, when higher power output and efficiency are required or desired, the amplifier is sometimes biased to operate in Class A/B. When biased to operate in Class A/B, however, the Class A/B amplifier power transfer curve 10 is less linear than for Class A amplifiers, illustrated in FIG. 1 by trace 14. To increase efficiency, communication systems often operate amplifiers in the non-linear region 12. This practice, however, does introduce amplitude and phase distortion components into the output signal produced by the amplifier.

As is also known in the art, most communication systems have FCC allocated frequency bandwidths 18 (that is, in-band frequencies) centered about a carrier frequency 20 as shown in FIG. 2A. For example, a CDMA (Code Division Multiple Access) communication system signal has a predefined bandwidth of 1.25 MHz. Different CDMA communication channels are allocated different bands of the frequency spectrum. Amplifiers are used in such systems, and are frequently biased to operate in Class A/B. Referring to FIG. 2B, signal processing such as amplification by an amplifier operating in the non-linear region 12 (FIG. 1) can produce distortion frequency "shoulders" 22a–22b outside a signal's allocated bandwidth 18. (These are called out-of-band frequencies.) These distortion frequency components 22a–22b can interfere with bandwidths allocated to other communication signals. Thus, the FCC imposes strict limitations on out-of-band frequency components.

Many techniques exist to reduce out-of-band distortion. One such technique is shown in FIG. 3 where a predistortion unit 24 is fed by a signal 25 to be amplified. The predistortion unit 24 has a power transfer characteristic 24a (FIG. 1) and compensates for distortion introduced by subsequent amplification in Class A/B amplifier 26. More particularly, the predistortion unit 24 transforms electrical characteristics (for example, gain and phase) of the input signal such that subsequent amplification provides linear amplification to the phase and frequency characteristics of the input signal. In one embodiment, compensation is effected by changing bias parameters of the predistortion amplifier or the main Class A/B amplifier. One method is described in U.S. patent application Ser. No. 09/047,332, filed Apr. 8, 1998, and titled DYNAMIC PREDISTORTION COMPENSATION FOR A POWER AMPLIFIER, the contents of which are incorporated herein, in their entirety, by reference. The predistortion unit 24 is configured with a priori measurements of the non-linear characteristics of the Class A/B amplifier. Unfortunately, the amplifier characteristics (amplification curve 10 with region 12 of FIG. 1) change over time and temperature making effective predistortion more difficult. For example, as the temperature of the amplifier increases, its non-linear region 12 may become more or less linear, requiring a compensating change in the transform performed by a predistortion unit 24. Some adaptive predistortion systems use look-up tables to alter predistorter characteristics based on environmental factors such as temperature. These look-up tables include predetermined predistorter control settings for use in predetermined situations. However, environmental factors alone do not determine the alterations in an amplifier's characteristics. Thus, over time, amplifier characteristics vary unpredictably due to aging of amplifier components.

Another approach to reduce amplifier distortion is to use feedforward compensation, as shown in FIG. 4. Here, a feedforward network 31 is included for reducing out-of-band distortion. The feedforward network 31 includes a differencing network or combiner 30, a main amplifier 33 operating as a Class A/B amplifier, an error amplifier 32, delay circuits 28 and 28a, and a combiner 29. The differencing network 30 produces an output signal representative of the difference between a portion of the signal fed to the amplifier 33 operated Class A/B and the signal fed to the amplifier 33 prior to such amplification. The frequency components in the differencing network 30 output signal are, therefore, the out-of-band frequency components 22a–22b introduced by amplifier 33. Amplifying and inverting the output produced by the differencing network 30, by error amplifier 32, produces an out-of-band correcting signal. More particularly, the combiner 29 combines the correcting signal produced by differencing network 30 and amplifier 32, with the delayed signal output of amplifier 31a thus reducing the energy in the out-of-band frequencies 22a–22b (FIG. 2B) of the signal output by amplifier 33. Feedforward network 31 includes delay line 28 to compensate for the delay in error amplifier 32. It should be noted that minute differences in timing between these elements can impair the effectiveness of a feedforward system. While a manufacturer can carefully match components prior to shipment, as feedforward components age, the correcting signal and processed signal can become mistimed if not properly compensated.

SUMMARY OF THE INVENTION

The invention relates to an apparatus and method for reducing out-of-band frequency components of an RF signal having a carrier frequency which is not known in advance. The RF signal has both in-band frequency components and out-of-band frequency components. The apparatus features a network for amplifying an input signal for producing the RF signal, the network having adjustable electrical bias parameters, and a control system connected to the network for locating a frequency within the bandwidth of the RF signal and for detecting energy in the out-of-band frequency components for producing a control signal related to the energy in the out-of-band frequency components. The control signal is coupled to the network to adjust the electrical bias parameters of the network to reduce the energy in the out-of-band frequencies.

In a preferred embodiment of the invention, the network has a predistorter having adjustable bias parameters controlled by the control signal. In another aspect, the network can include a power amplifier having adjustable bias parameters controlled by the control signal. In this instance, preferably, the amplifier is a MOSFET amplifier. The network, in other aspects, can include a feed forward network and the signal can be, for example, a CDMA signal, having well known characteristics.

The method of the invention includes locating an in-band frequency component of the signal, detecting energy at frequencies which are at a predetermined offset from the located in-band frequency component, and adjusting network electrical bias parameters, such as amplifier bias, to reduce the out-of-band frequency energy.

In particular aspects, the method features measuring the energy at a first frequency, measuring the energy at a second frequency, and determining whether the energy measured at the second frequency exceeds the energy measured at the first frequency by more than a selected threshold. In particular aspects, the method heterodynes the signal having out-of-band frequencies to baseband.

In one particular aspect of the invention, the apparatus includes a predistorter connected to receive an input signal and having an output coupled to a power amplifier. The predistorter has a nonlinear output signal versus input signal transfer characteristic which can be selectably adjusted by changing bias parameters of the predistorter, in accordance with an out-of-band feedback control signal provided by a feedback loop. The result is a substantially linear amplifier output versus input transfer characteristic. The feedback loop, in this embodiment, has a control signal connected to the power amplifier output for locating the carrier frequency of the input signal and for producing a feedback control signal related to the energy in the distortion frequency components outside the bandwidth of the input signal. The feedback control signal is coupled to the predistorter to change bias parameters of the predistorter to reduce the energy in the out-of-band frequency components of the amplifier output.

The method and apparatus thus advantageously reduce distortion in an amplified RF signal, for example, where a Class A/B high powered RF amplifier is used for efficiency and for high-powered output.

BRIEF DESCRIPTION OF THE DRAWINGS

Reference is made to the following drawings, in which.

DESCRIPTION OF THE PREFERRED EMBODIMENTS

Figure 1:
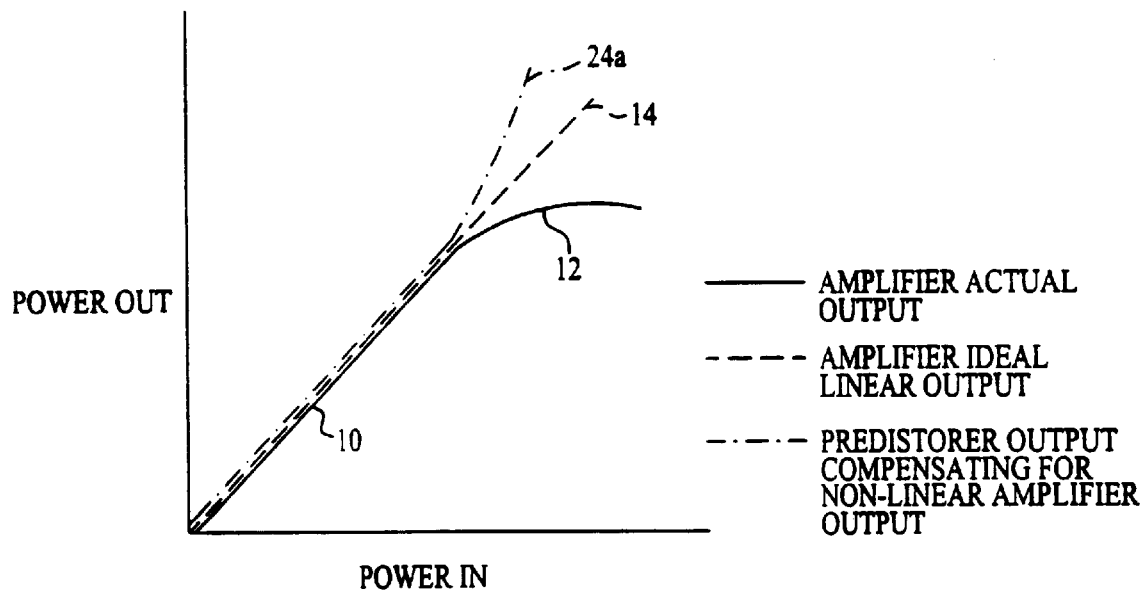
FIG. 1 is a graph illustrating amplifier output regions according to the PRIOR ART.
Figure 2A:
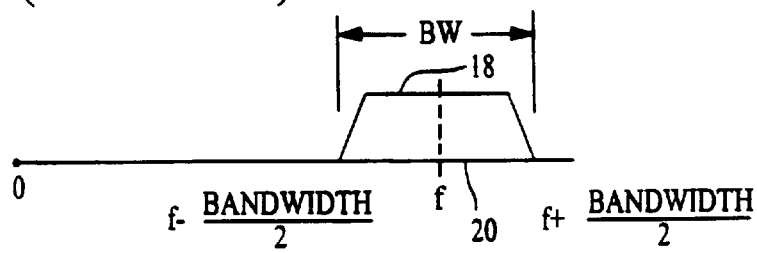
FIGS. 2A and 2B are diagrammatical sketches of a signal having in-band and out-of-band frequency components according to the PRIOR ART.
Figure 2B:
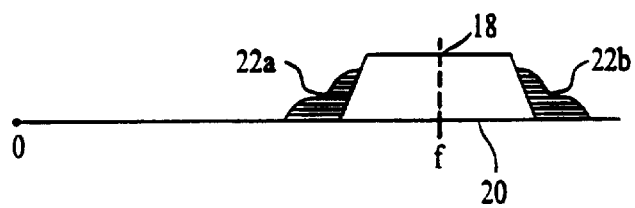
Figure 3:
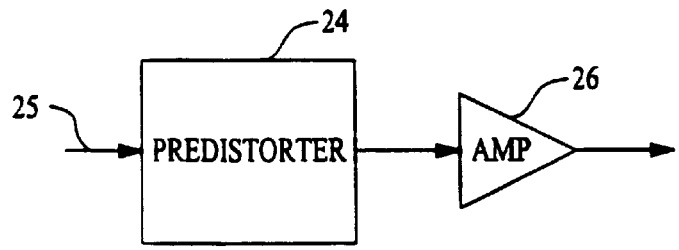
FIG. 3 is a diagrammatical sketch of an amplification system according to the PRIOR ART.
Figure 4:
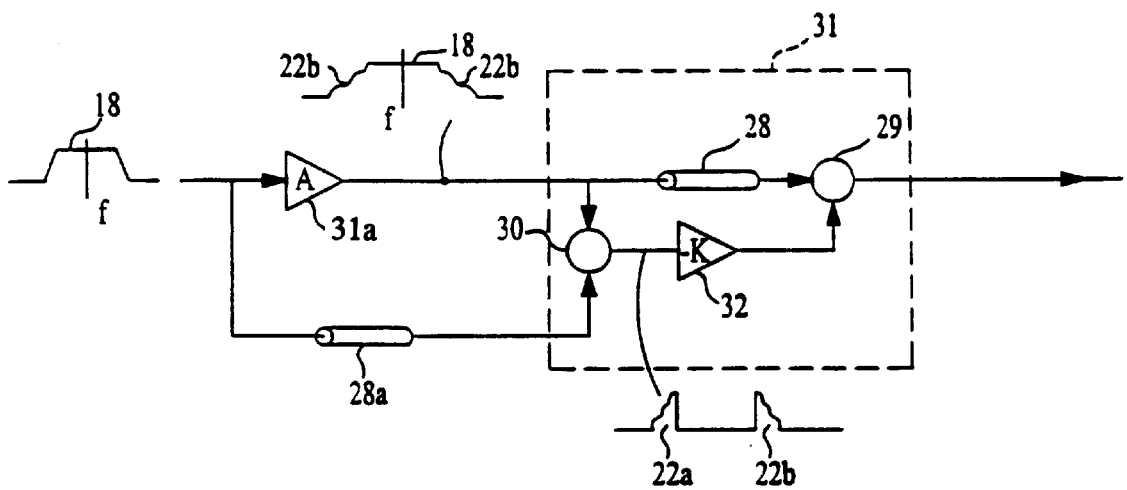
FIG. 4 is a diagrammatical sketch of another amplification system according to the PRIOR ART.
Figure 5:
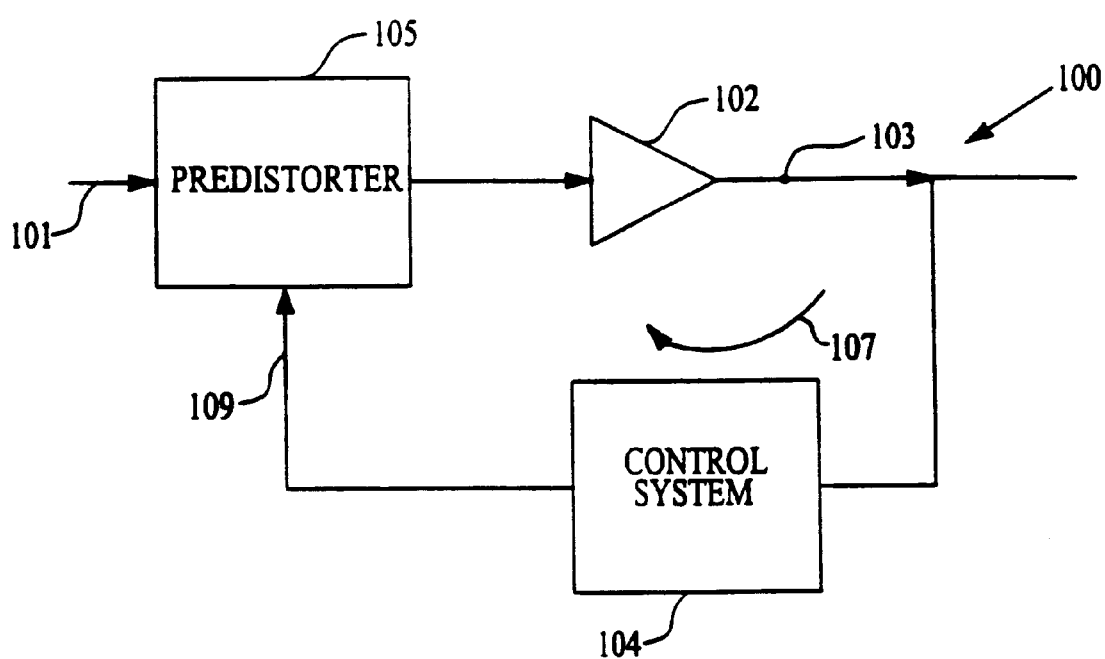
FIG. 5 is a diagrammatical sketch of an amplification system having a predistorter with adjustable electrical characteristics according to the invention.

Referring to FIG. 5, an amplification system 100 is shown amplifying an input signal fed thereto on a line 101. More particularly, the system 100 provides an amplified output signal on a line 103. The system 100 includes an amplifier 102, a control system 104, the details being shown in FIG. 7), and a predistorter 105, all arranged as shown. The input signal on line 101, in this embodiment, is a received CDMA signal. The received signal has a predetermined, a priori known, bandwidth "BW"; however, the carrier frequency $f_c$ of such received signal may be any one of a plurality of available carrier frequencies and is not known in advance.

The amplifier 102 is biased to Class A/B, and thus has a non-linear amplification characteristic. Therefore, non-linear amplification by the amplifier 102 will introduce amplitude and phase distortion into the amplified output signal. Thus, passing a signal through the amplifier 102, operating with a non-linear output power versus input power transfer characteristic produces frequency components outside the bandwidth BW (that is, out-of-band frequency components).

In this illustrated embodiment, however, the output signal produced by the amplifier 102 is fed, using the control system 104, to the predistorter 105. The predistorter 105 has adjustable electrical characteristics, for example, adjustable bias characteristics and parameters. The predistorter 105 receives the input signal on line 101 and the output of the control system 104, over line(s) 109. The output of the predistorter 105 is fed to the amplifier 102. The predistorter 105 has a non-linear gain versus input signal level characteristic selected in accordance with an out-of-band feedback control signal (the signals over line(s) 109) to enable the amplification system 100 to provide a substantially linear amplifier output power versus input signal power transfer characteristic to the input signal 101. Thus, in the steady-state, the output on line 103 is an amplification of the input signal on line 101 without, or with reduced, out-of-band frequency components. As will be described, any out-of-band frequency energy in the output signal on line 103, as the result of drift in the amplifier 102, for example, is detected and is fed to the predistorter 105 using the control system 104 to enable the system 100 to again produce, in the steady-state, an output signal on line 103 with little, or no, out-of-band frequency components.

More particularly, a feedback loop 107 is provided wherein the control system 104 receives the output of the amplifier 102 and produces the feedback control signal on line 109 for the predistorter 105. The control system 104 analyzes the signal produced by the amplifier 102 to locate a carrier frequency having the bandwidth BW of the received signal, here the carrier frequency of the input signal on line 101, and to produce the feedback control signal on line 109 related to the energy in the distortion frequency components (that is, the energy out of the bandwidth BW) detected in the output signal on line 103. In the illustrated embodiment, the control system 104 measures the energy of the distortion frequency components by measuring energy at a frequency or frequencies offset from the carrier frequency (for example, at frequencies 800 KHz and 1.25 MHz from the carrier frequency), the measurement frequency(s) being outside of the bandwidth of the input signal. The feedback control signal on line 109 is coupled to the predistorter 105 for adjusting characteristics of the predistorter 105 (for example gain and phase, or predistorter bias points) and thereby null (that is, reduce) the energy in the out-of-band signals on line 103.

Figure 6A:
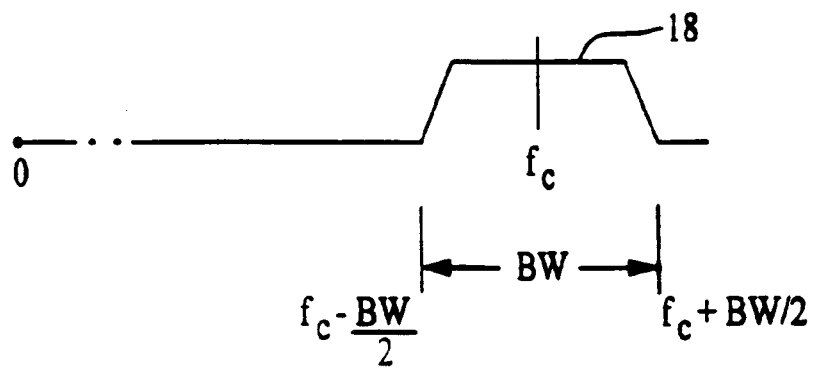
FIGS. 6A–6C are diagrammatical sketches of frequency spectra of signals produced in the amplification system of FIG. 5.
Figure 6B:
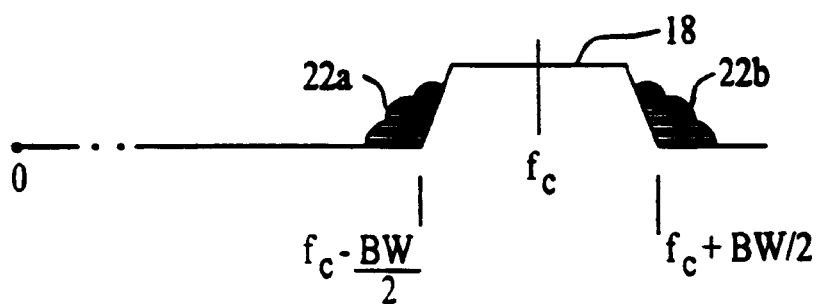
Figure 6C:
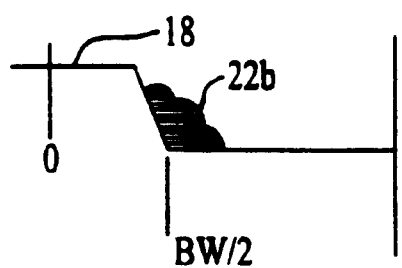

Referring again to FIG. 5, in one embodiment, the control system 104 heterodynes to baseband the amplified signal on line 103 with the carrier frequency of the received signal and measures the energy in the output signal on line 103 at one or more predetermined offsets from the carrier frequency. Referring also to FIGS. 6A–6C, the frequency spectrum 18 of the input signal on line 101 is shown in FIG. 6A. The frequency spectrum of the output signal on line 103, in a non-steady-state condition, that is before correction, is shown in FIG. 6B to have out-of-band frequency components 22a, 22b resulting from the non-linear operation of amplifier 102. The frequency spectrum resulting from heterodyning to baseband the output signal on line 103 with the carrier frequency of the input signal is shown in FIG. 6C.

As shown in FIG. 6A, the input signal on line 101 is centered about carrier frequency $f_c$ and has an a priori known bandwidth BW. In the case of a CDMA signal, BW will be 1.25 MHz. As shown in FIG. 6B, amplification by amplifier 102, prior to steady-state, introduces out-of-band distortion components 22a and 22b to the output signal on line 103. The control system 104 heterodynes the amplified signal on line 103 (FIG. 6B) to baseband, thus centering the signal about DC (zero frequency) as shown in FIG. 6C. After heterodyning, the out-of-band distortion components appear at frequencies greater than an offset of BW/2 from DC or in the case of a CDMA signal at frequencies above 0.625 MHz. The control system 104 produces control signals based on amount of energy measured at, for example, 0.625 MHz or other predetermined frequency offsets. That is, control system 104 produces control signals based on the amount of out-of-band energy in components 22a, 22b.

Figure 7:
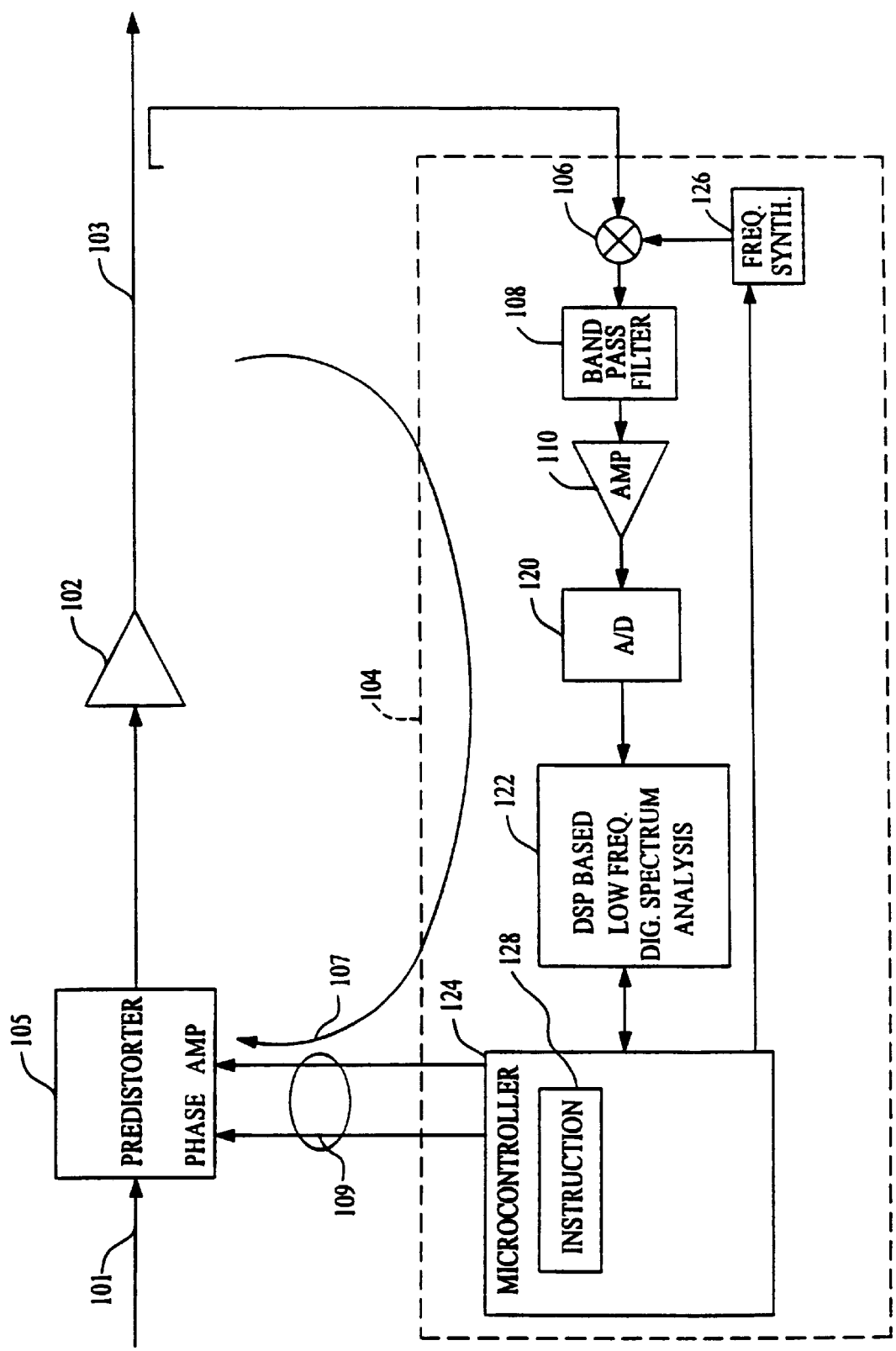
FIG. 7 is a diagrammatical sketch of the amplification system of FIG. 5, a control system of such amplification system being shown in more detail.

More particularly, and referring to FIG. 7, in one embodiment, the control system 104 is shown in more detail and includes a microcontroller 124 that controls a frequency synthesizer 126 to heterodyne (here, to bring down to baseband) the signal produced by amplifier 102 on line 103. A mixer 106 receives the output of the frequency synthesizer 126 and the amplifier output on line 103, and delivers its output to a bandpass filter 108 that eliminates in-band frequency components of the heterodyned signal to enhance resolution of the out-of-band distortion components. An amplifier 110 receives the filtered signal and provides its amplified output to an analog-to-digital converter 120, the digital output of which is delivered for digital signal analysis by a digital signal processor (DSP) 122. The DSP is specially configured to effect a spectrum analysis on the digital input signal from the analog-to-digital converter 120. The microcontroller 124, executing firmware instructions 128, queries the DSP 122 for the energy measurements at predetermined offsets. The microcontroller 124 analyzes past and present energy measurements to produce control signals over lines 109 that adjust the electrical characteristics, for example, a phase and gain, of the predistorter 105.

Figure 8:
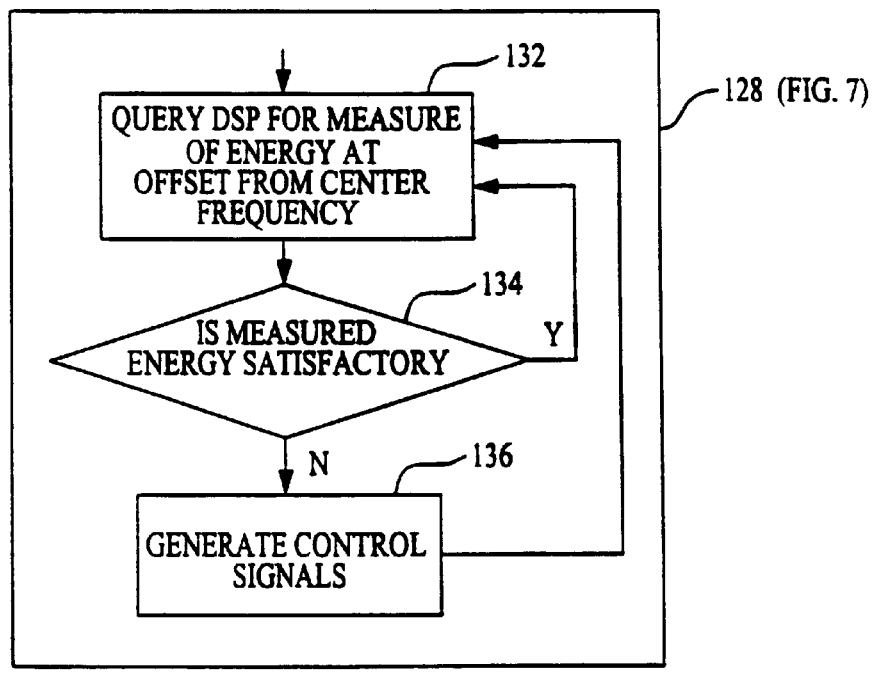
FIG. 8 is a flow chart of the process used by the control system in FIG. 7 to produce control signals based on energy in out-of-band frequency components.

Referring also to FIG. 8, in operation, the microprocessor instructions 128 continuously monitor distortion levels by querying the DSP 122 for measurement data describing the energy at offsets from the now baseband signal center frequency (step 132). After determining whether the current measurement process is operating satisfactorily (step 134) (that is, distortion is reduced to predefined minimum levels for the system), by analyzing past and current measurements, the microprocessor produces the control signals on lines 109 (step 136) that reduce or maintain the distortion level. The control signals on lines 109 adjust different electrical characteristics, for example, the phase and amplitude characteristics of the predistorter 105 or bias characteristics of the predistorter, to null any out-of-band frequency components 22a, 22b in the output signal on line 103. It should be noted that reducing distortion may require dynamic experimentation with different combinations of control signals before identifying a set of control signals that best minimize distortion.

Figure 22A:
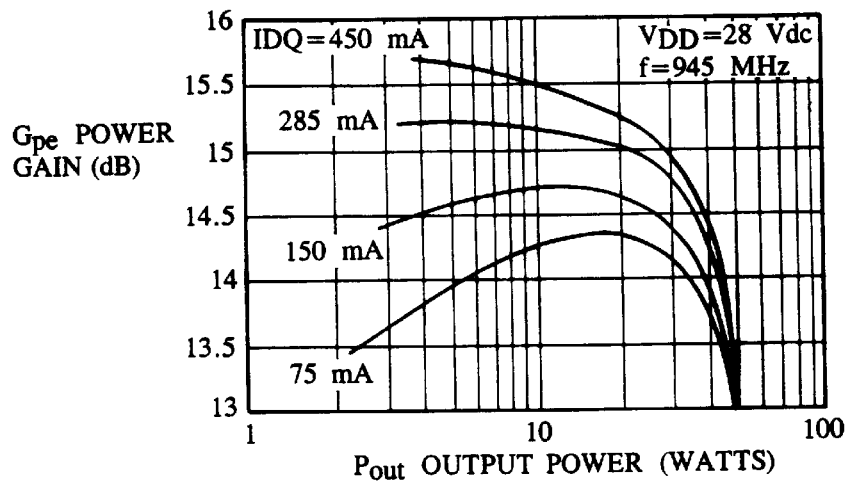
FIGS. 22A and 22B show typical power gain and intermodulation distortions versus output power for a typical MOSFET device.
Figure 22B:
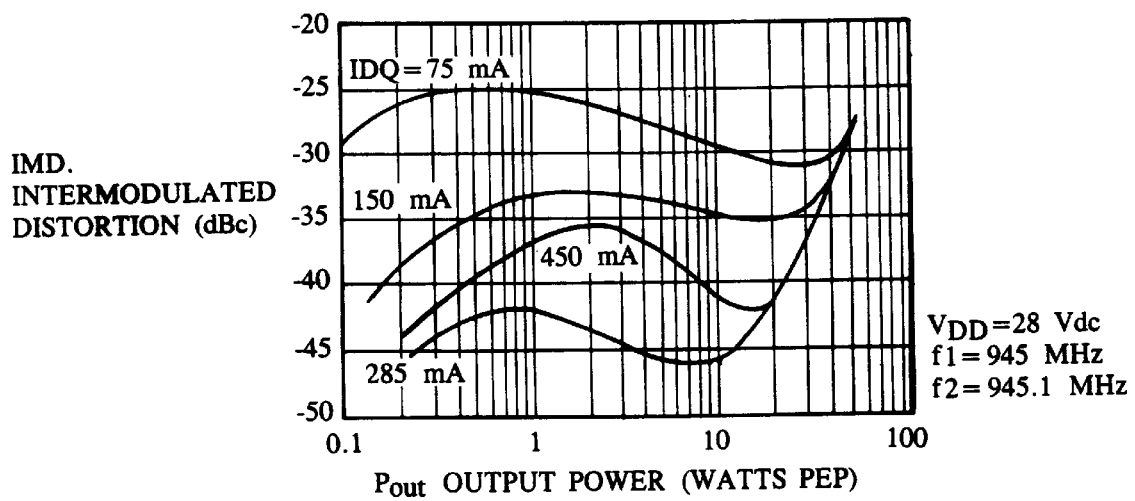

In a particular embodiment of the invention where the bias characteristics being adjusted are the quiescent current of a MOSFET transistor, the effect can be substantial. Thus, FIGS. 22A and 22B illustrate the variation of modulation and power gain as a result of variation in output power. For that typical device, for example, a current of 285 mA would appear to be a best choice, for that particular operating condition, to provide the lowest intermodulation distortion with a best power gain characteristic.

Figure 9:
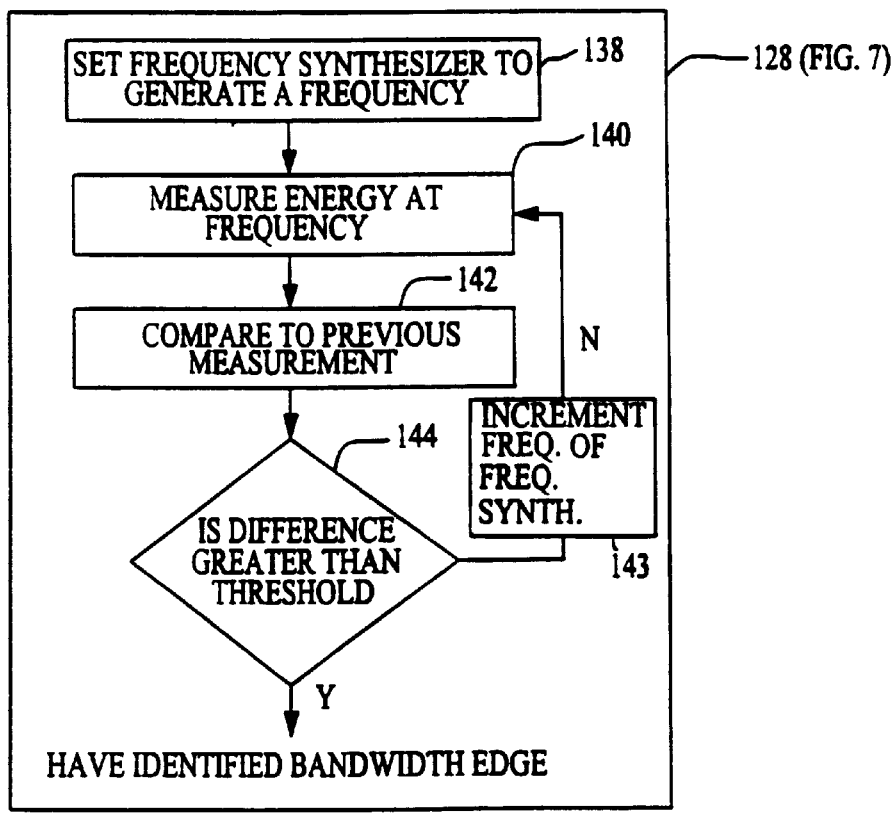
FIG. 9 is a flow chart of the process used by the control system of FIG. 7 to determine frequency components of a signal produced in the amplification system of FIG. 7.

Referring again to FIG. 7, in addition to generating control signals on lines 109, the microcontroller 124 executes instructions that control the frequency fed to mixer 106 by frequency synthesizer 126. Referring to FIG. 9, in operation, the microcontroller 124 uses the frequency synthesizer 126 to incrementally sweep through the frequency spectrum to find the carrier frequency $f_c$. The microcontroller 124 initiates the search for the carrier frequency $f_c$ by setting the frequency synthesizer 126 to produce a low frequency (step 138). The microcontroller 124 queries the DSP 122 for a measure of the carrier energy at this frequency (step 140). This corresponds to a DC measurement of the signal output of mixer 106. The microcontroller 124 compares the energy measurement with the measurement of energy at a previously selected carrier frequency produced by the frequency synthesizer (step 142). If the comparison (step 142) indicates a steep rise (step 144) in energy characteristic of a signal having a predefined bandwidth, the microcontroller 124 can freeze the frequency synthesizer at this or a nearby frequency. If the comparison (step 142) does not indicate the presence of a signal (that is, very little energy in either the present or previous energy measurement), the microcontroller 124 will increment the frequency produced by the frequency synthesizer 126 (step 143). In a typical CDMA system, the frequency synthesizer will be incremented in 50 KHz steps. (Other, or random, search patterns can also be used.) Finding the carrier frequency usually needs only to be performed upon start-up as an allocated frequency usually remains constant. The search can be periodically repeated, however, to ensure proper calibration. The results of the search can be stored to obviate the need for searching each time the equipment is start-up. The instructions of the microcontroller 124 can be altered to search for different signals other than CDMA signals.

Figure 10:
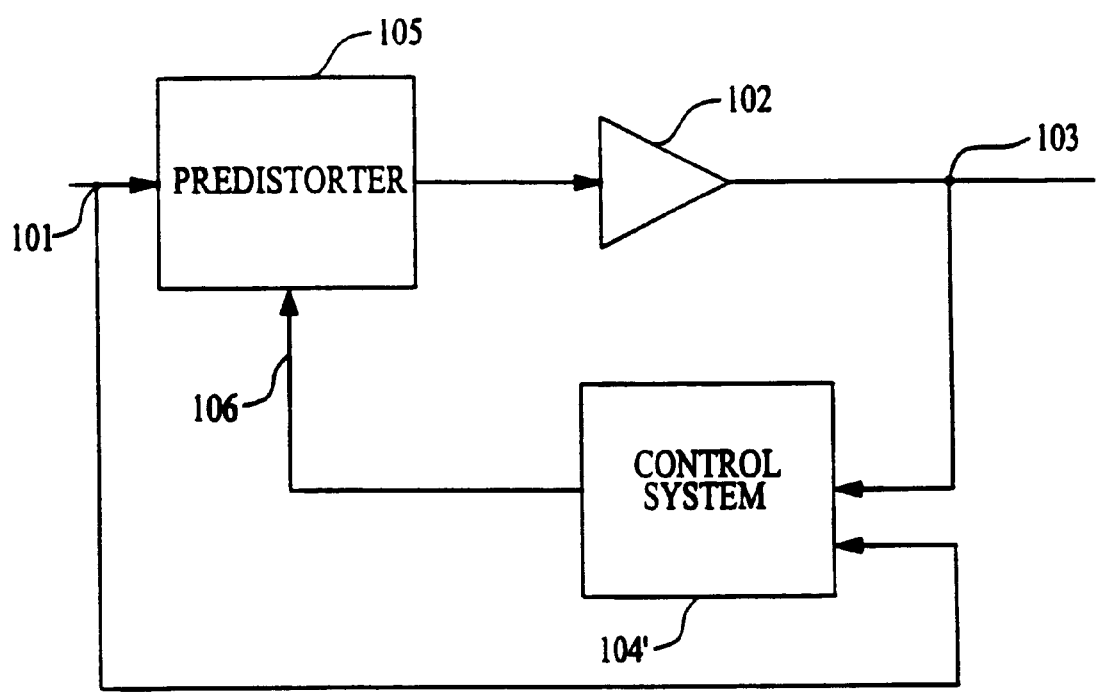
FIG. 10 is a diagrammatical sketch of an amplification system having a predistorter with adjustable electrical characteristics according to another embodiment of the invention.
Figure 12:
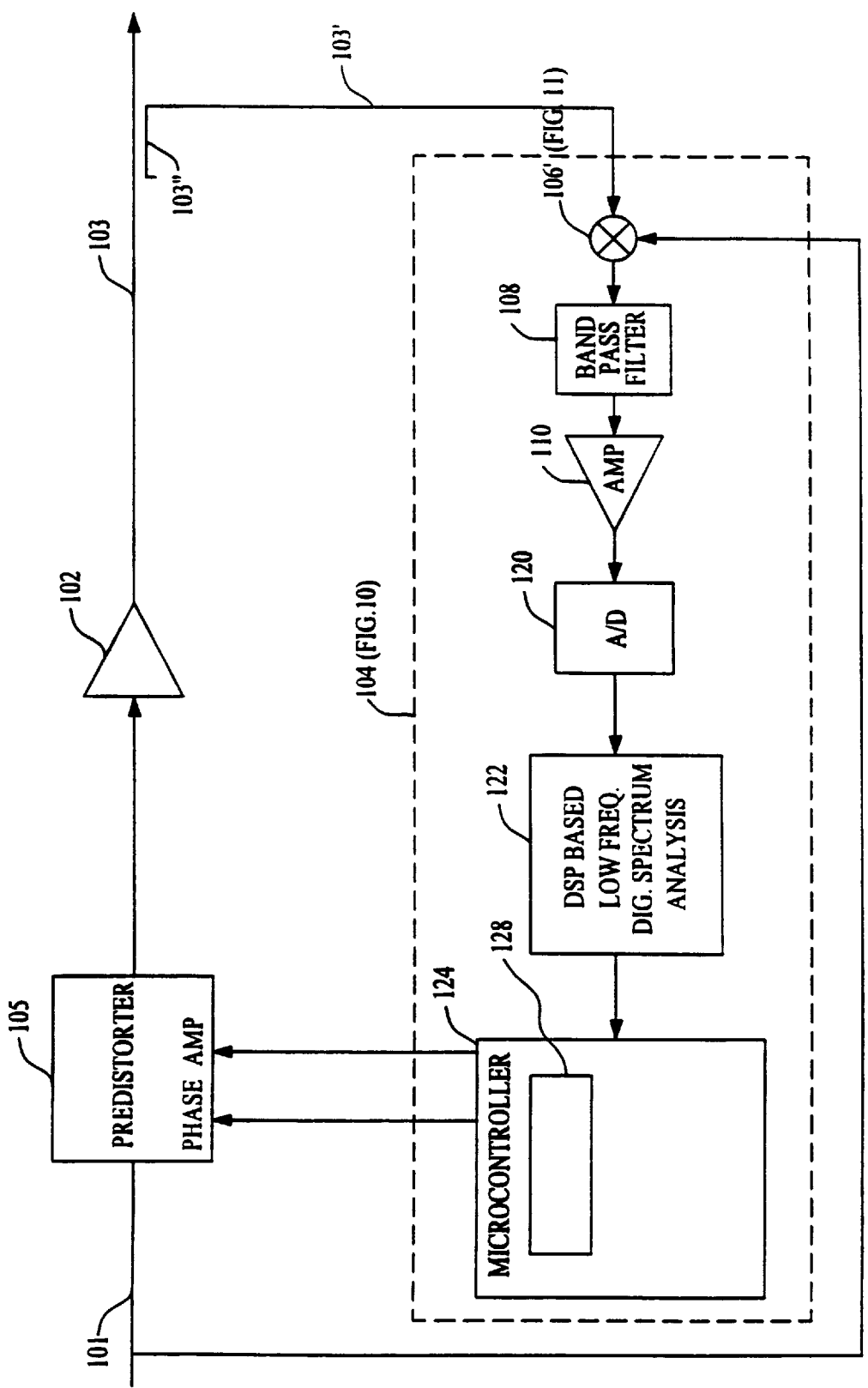
FIG. 12 is a diagrammatical sketch of the amplification system of FIG. 10, a control system of such amplification system being shown in more detail.

Referring to FIG. 10, in another particular embodiment, the control system 104, here designated as control system 104', has an alternate configuration for reducing distortion in the amplification system. Control system 104' receives both the original input signal on line 101 (FIG. 6A) and the amplifier output signal on line 103 having, in the non-steady-state condition, distortion components introduced by the amplifier 102 (FIG. 6B). By mixing the original input signal on line 101 with the signal on line 103 which can have distortion components, the control system 104' quickly heterodynes the amplified signal on line 103 to baseband without scanning the frequency spectrum to determine the input signal's carrier frequency $f_c$. That is, instead of searching for the carrier frequency of the input signal on line 101, the input signal itself serves as the signal for a mixer 106' (FIG. 12) in a homodyne arrangement. In any event, the control system 104' thus locates a frequency within the bandwidth (BW), here the center frequency of the received signal, by automatically homodyning, mixing, and filtering as provided by mixer 106' and low pass filter 108 (FIG. 12). Mixing a signal in this manner, however, imposes a constraint upon the mixer used by the control system.

More particularly, many mixers depend on a threshold amount of energy to multiply signals without introducing distortion. For example, diode mixers introduce distortion into an output signal if the energy in either of its two input signals falls below a level needed to keep the mixer diodes operating in their linear region. Many signals, including CDMA signals, sometimes fail to provide this minimum energy, thereby introducing distortion.

Figure 11:
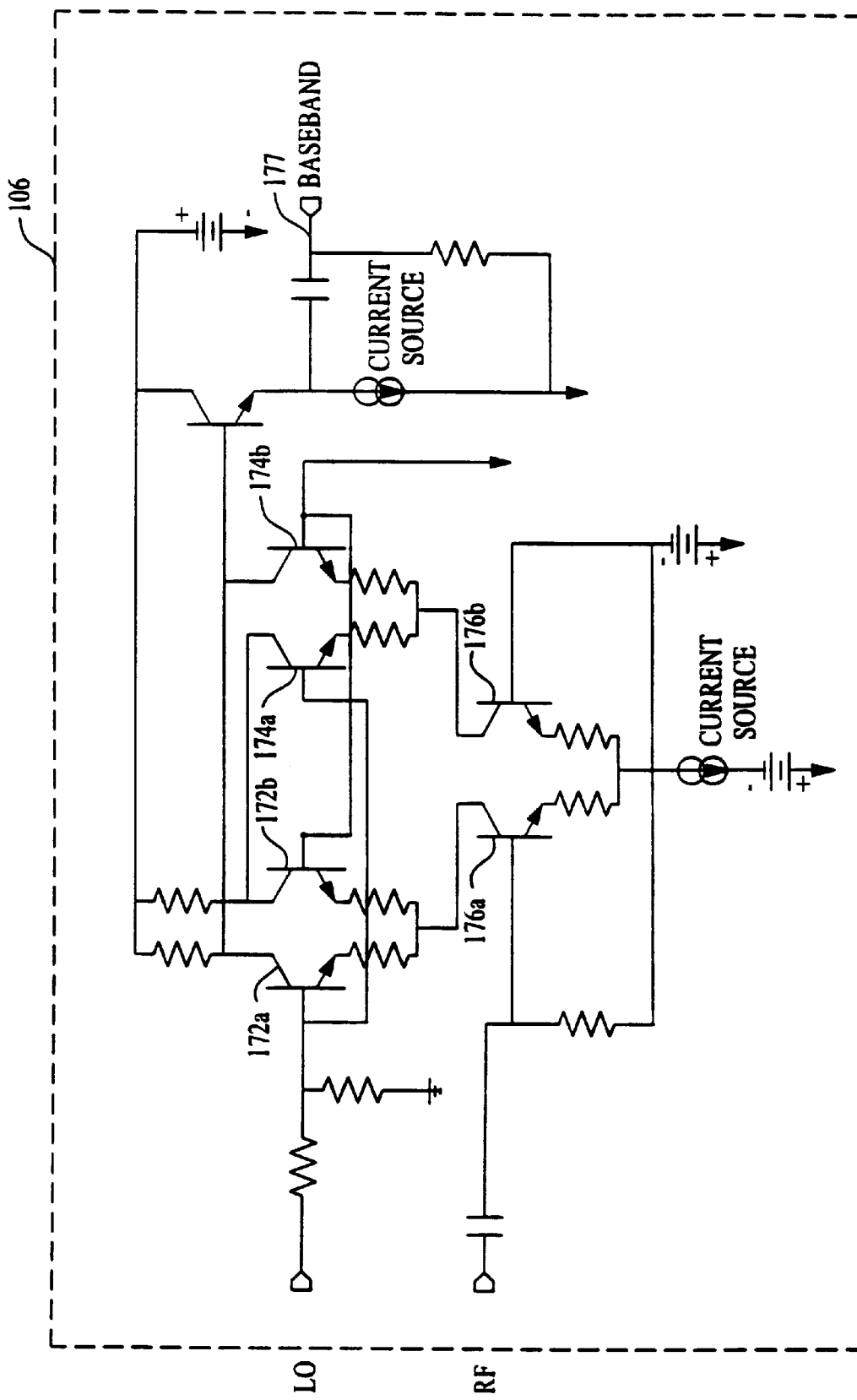
FIG. 11 is a diagrammatical sketch of a mixer configured as a four quadrant multiplier biased into a linear operating region, such mixer being adapted for use in the amplification system of FIG. 10.

Referring to FIG. 11, many mixers, such as a Gilbert Cell mixer, remain linear even when the input signals have little energy. As shown, Gilbert Cell mixer 106' includes active devices configured as a four quadrant multiplier biased into a linear operating region. These active devices form a differential amplifier 176a–176b that drives dual differential amplifiers 172a–172b and 174a–174b. The mixer output, on a line 177, is thus available for filter 108.

Referring to FIG. 12, an amplification system 101', using a homodyning mixer 106', is shown for measuring the energy in frequency bands of a received signal, such signal having an allocated frequency bandwidth and a carrier frequency. The system 101' includes mixer 106' having active devices configured as a four quadrant multiplier biased into a linear operating region for enabling the mixer to handle low input signal levels. The mixer 106' receives a pair of signals, one of the signals being the received signal (that is, the original input signal on line 101) and the other signal, on line 103', being a portion of the output on line 103 from a coupler 103". The output of mixer 106' is processed, as was the output of mixer 106 (FIG. 7) by the remaining components of the control system 104' which detect energy in a frequency band at a predetermined offset from the baseband carrier (center) frequency as described above in connection with FIG. 7. Note that in an alternate embodiment of those illustrated in FIGS. 7 and 12, the DSP 122 (and its related circuitry) can be replaced by bandpass filters, each adapted to pass signals only at selected offsets from the center frequency. Other circuitry would measure the energy from each filter and provide that data to the microprocessor.

Figure 13:
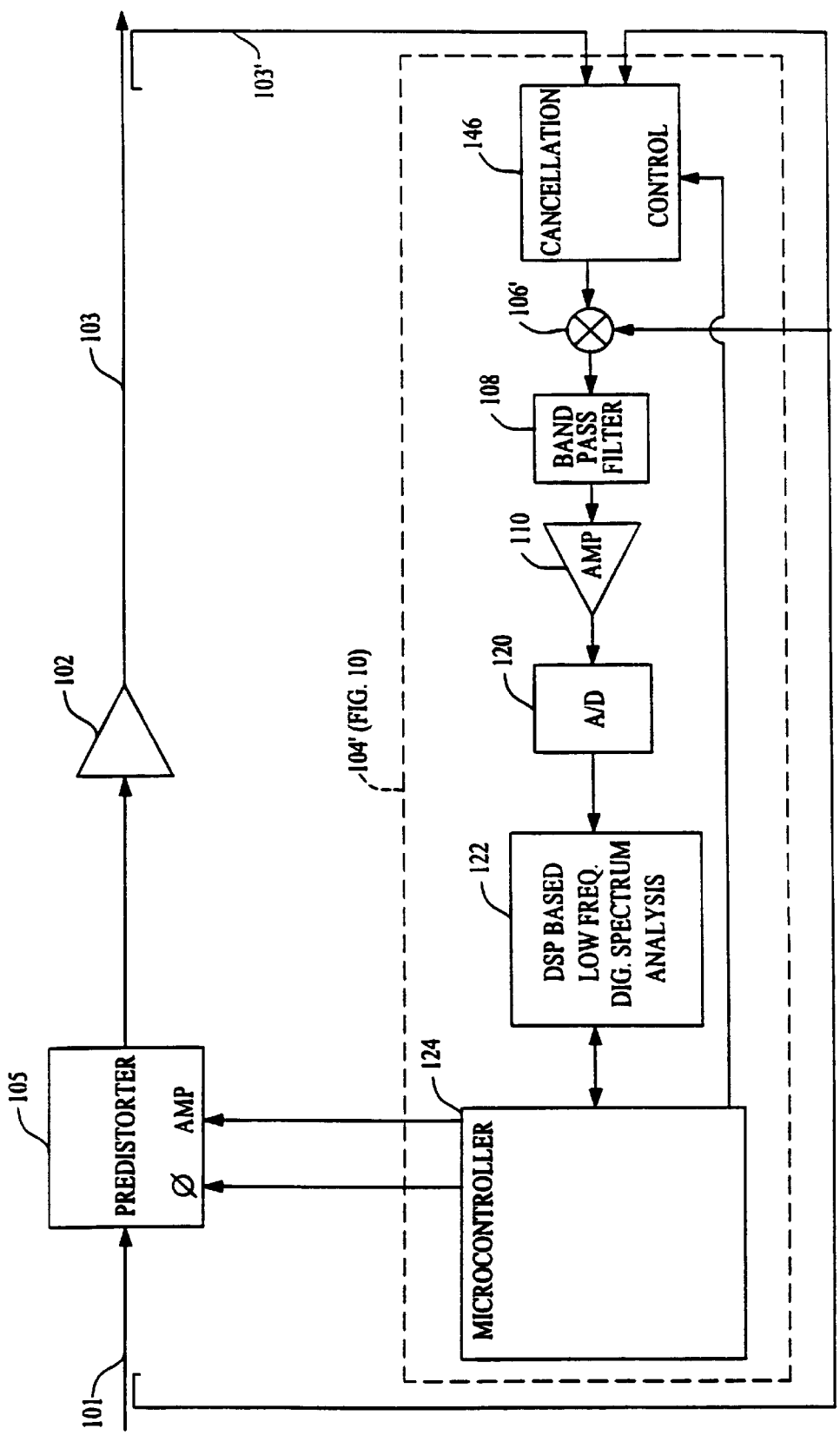
FIG. 13 is a diagrammatical sketch of an amplification system according to another embodiment of the invention, such amplification system having a cancellation network configured to increase dynamic range of out-of-band signal components.

Referring now to FIG. 13, the use of the four-quadrant linear multiplier (that is, mixer) 106' can pose a dynamic range problem. However, cancelling in-band frequencies to isolate the out-of-band distortion components can increase the dynamic effective range of the mixer. Thus a cancellation network 146, under microprocessor control, performs this isolation function, thereby in effect, increasing the dynamic range of the mixer. The operation and structure of cancellation network 146 is illustrated in FIGS. 14 and 15.

Figure 14:
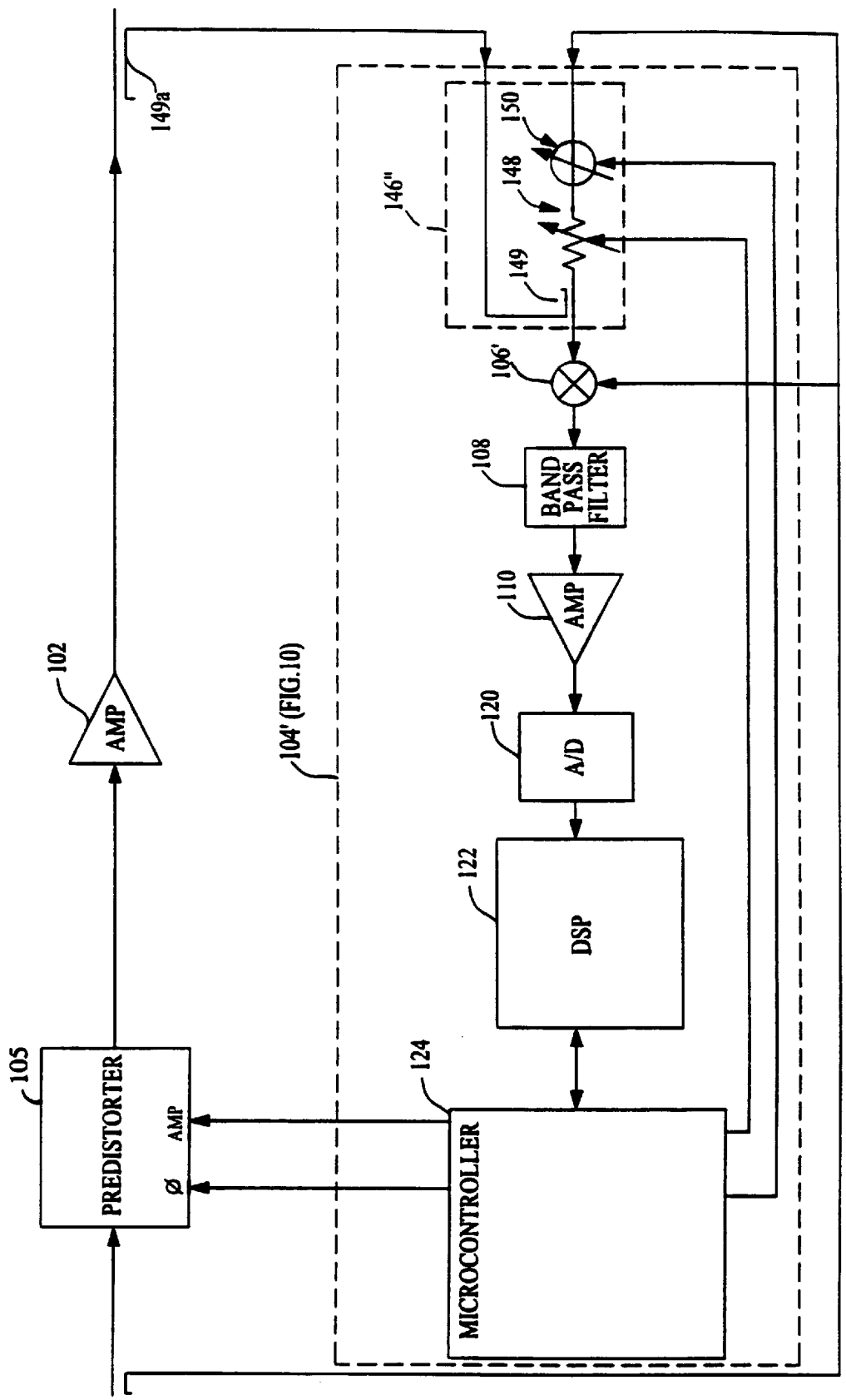
FIG. 14 is a diagrammatical sketch of an amplification system, such amplification system having a cancellation network configured to increase dynamic range of out-of-band signal components according to another embodiment of the invention.

Referring now to FIG. 14, one embodiment of the cancellation network 146 is shown which uses a voltage controllable phase shifter 150 and a voltage controllable attenuator 148 to substantially cancel in-band frequency components in the amplifier output signal on line 103. The microcontroller 124 adjusts the phase shifter 150 and attenuator 148 to modify the phase of a sample of the original input signal on line 101 (FIG. 6A) by 180° C. and thereby null the in-band frequency components of the signal on line 103, from a coupler 149a, as they are coupled to the output of variable attenuator 148 using a coupler 149. The microcontroller 124 can repeatedly adjust the phase shifter 150 and attenuator 148 until the in-band's signal cancellation is at maximum level.

Figure 15:
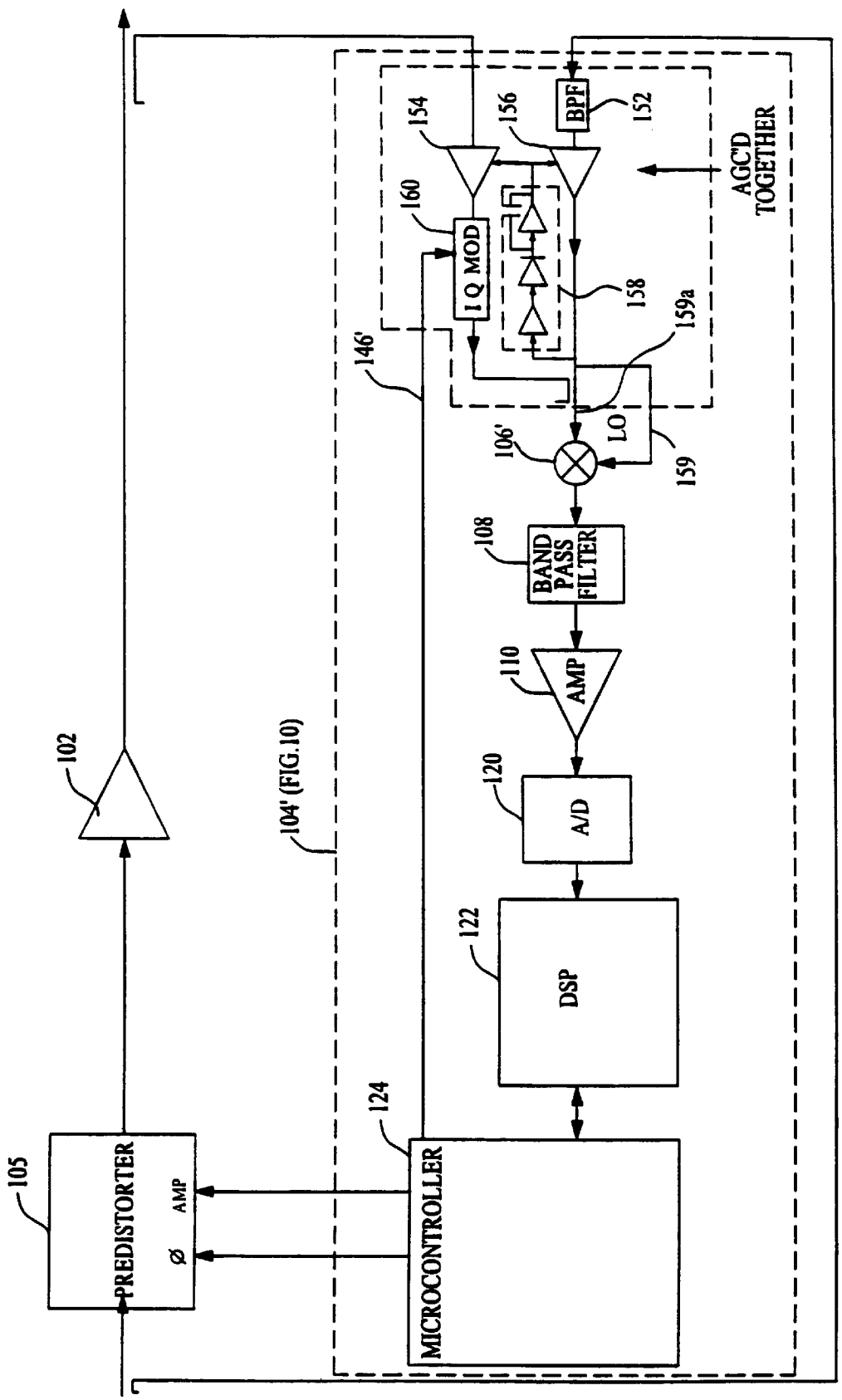
FIG. 15 is a diagrammatical sketch of an amplification system, such amplification system having a cancellation network configured to increase dynamic range of out-of-band signal components according to another embodiment of the invention.

Referring to FIG. 15, an alternative embodiment of the cancellation network 146' uses an automatic gain control element (AGC) 158, as is well known in the field, to effectively increase the dynamic range of the mixer. The AGC 158 controls an amplifier 156 to hold the local oscillator (LO) input of mixer 106' over a line 159 constant so that the down converted output of the mixer 106' is a linear function of the input over line 159a and no longer a multiplicative function of the inputs to the cancellation network 146'. The AGC 158 also matches the outputs of amplifiers 154 and 156. Phase and gain network 160 enables the microcontroller 124 to adjust the signal fed into mixer 106' and thereby increase dynamic range.

Figure 16:
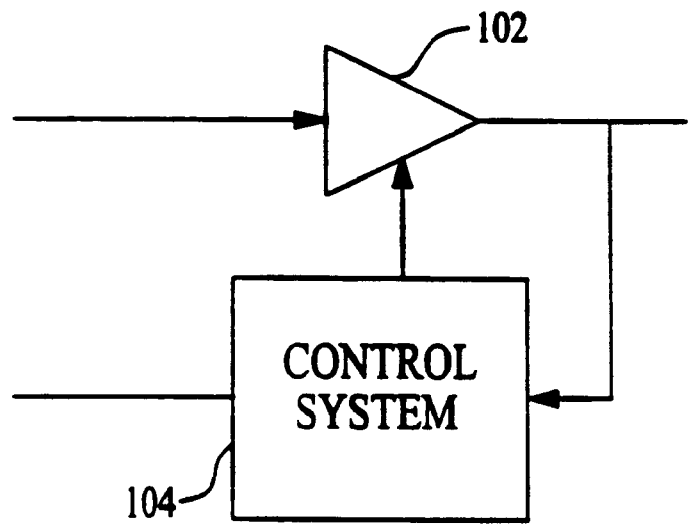
FIG. 16 is a diagrammatical sketch of an amplification system having adjustable characteristics being controlled by the control system of FIG. 5 according to the invention.
Figure 17:
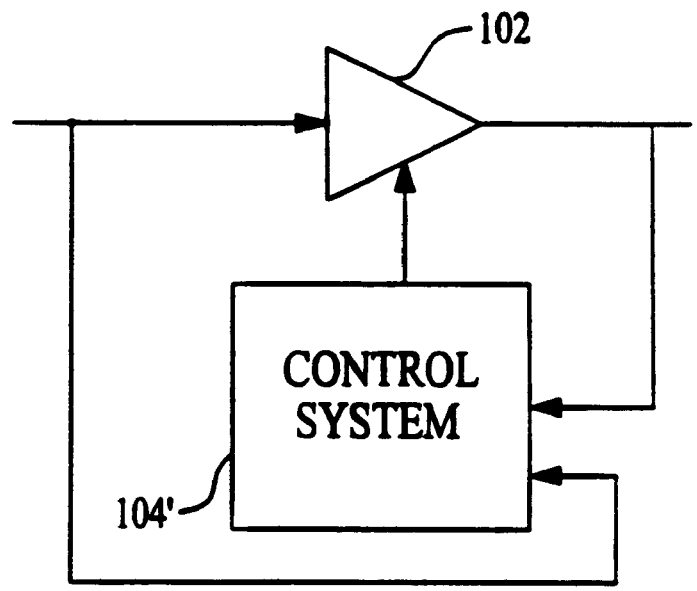
FIG. 17 is a diagrammatical sketch of an amplifier having adjustable characteristics being controlled by the control system of FIG. 10 according to the invention.

The control systems 104 and 104' can control a wide variety of amplification system networks having adjustable characteristics other than predistorter 105. For example, in particular, referring to FIGS. 16 and 17, corresponding to FIGS. 5 and 12, respectively, the control system 104, 104' can control the amplification characteristics of amplifier 102 by altering the amplifier's bias point(s). While a predistortion circuit is not shown, it can be advantageously employed to further reduce unwanted distortion. As described in co-pending U.S. application Ser. No. 09/057,380, filed Apr. 8, 1998, incorporated herein, by reference, in its entirety, over long periods of time (for example, hundreds of hours)

amplifiers frequently exhibit a drift in operating bias current. Amplification by an amplifier experiencing drift can introduce out-of-band distortion components into a signal. The control system 104, 104' can generate control signals that control the bias of the amplifier based on out-of-band frequency energy to compensate for amplifier bias current drift. This method of compensation is particularly useful in connection with MOSFET devices, and in particular lateral MOSFETS where the gate bias is critical.

Figure 18:
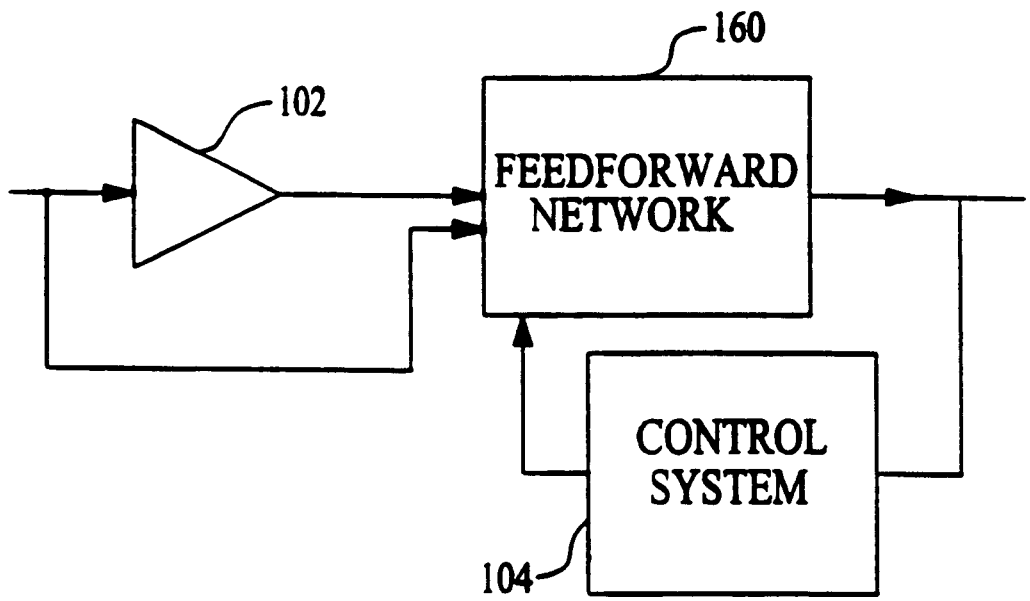
FIG. 18 is a diagrammatical sketch an amplification system having a feedfoward network with adjustable electrical characteristics controlled by the control system of FIG. 5 according to the invention.
Figure 19:
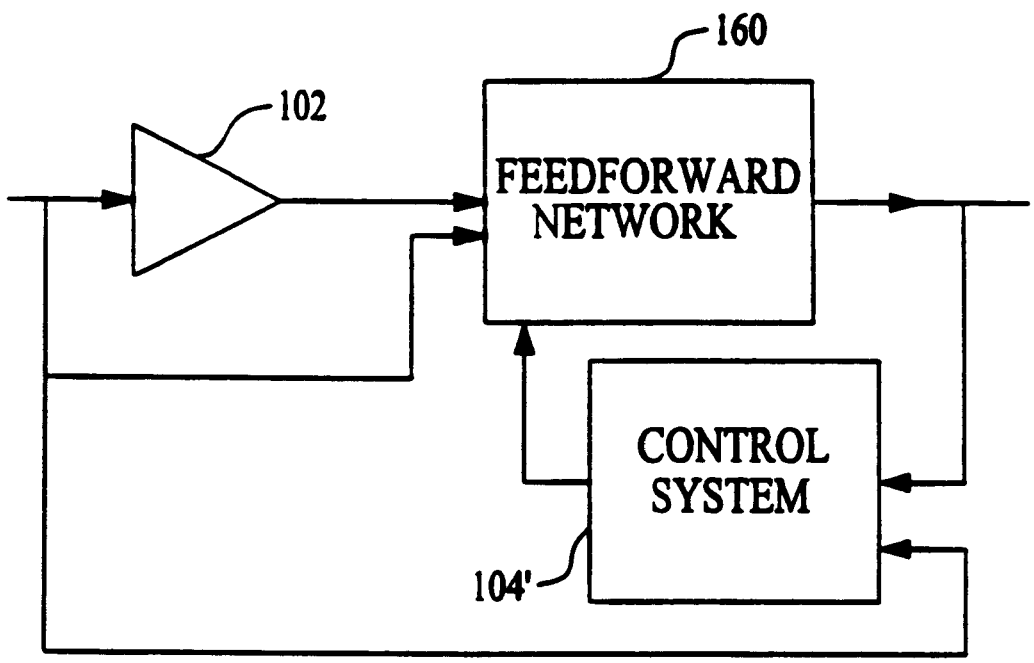
FIG. 19 is a diagrammatical sketch of an amplification system having a feedforward network having adjustable characteristics being controlled by the control system of FIG. 10 according to the invention.
Figure 20:
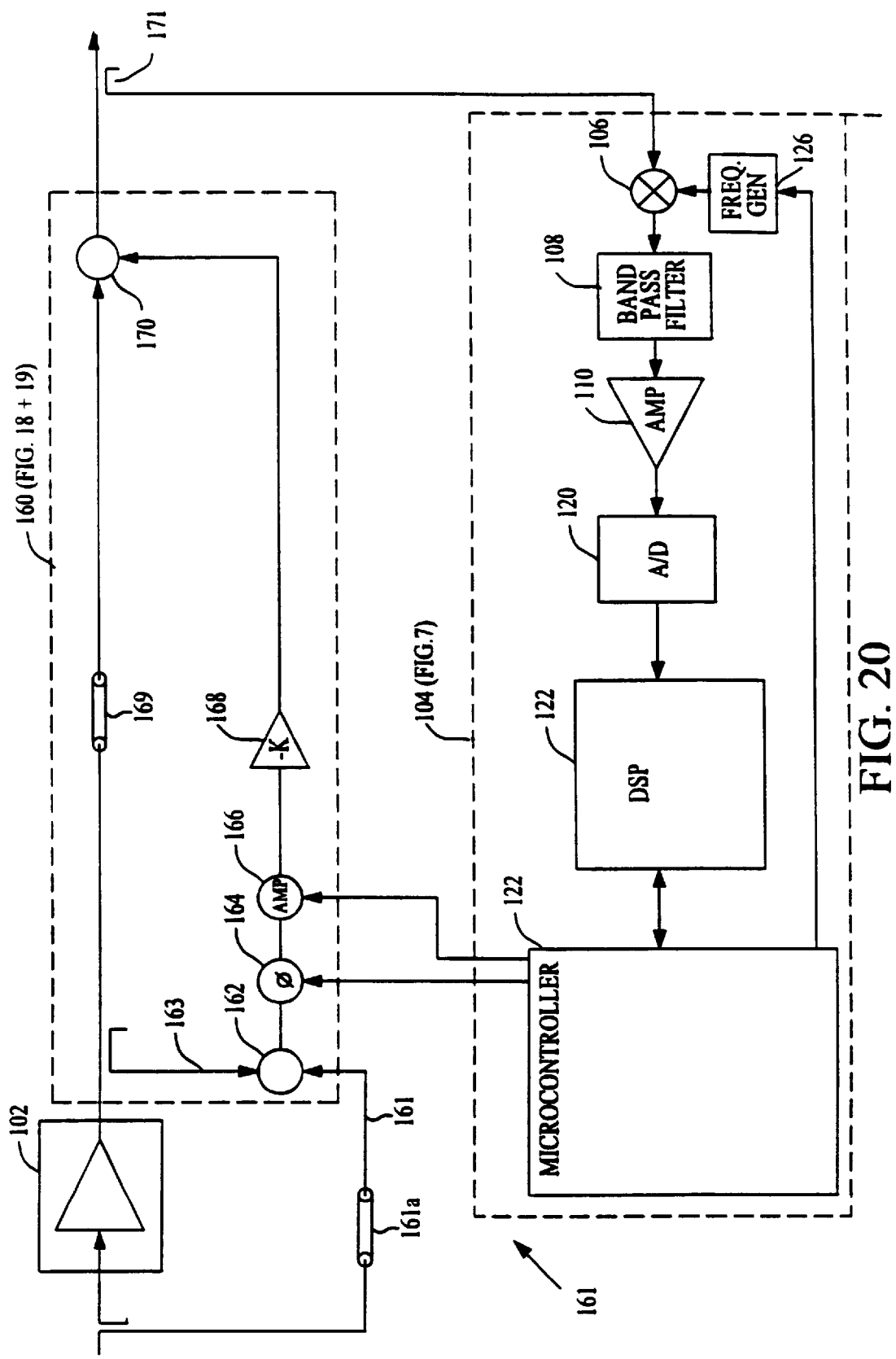
FIG. 20 is a diagrammatical sketch of an amplification system having a control system adapted to control the adjustable electrical characteristics of the feedforward network of FIG. 18.

In addition, referring to FIGS. 18, 19, the control system 104, 104' can also reduce distortion by adjusting the characteristics of a feedforward network 160. As noted with regard to FIGS. 16 and 17, a predistorer circuit can be advantageously used to further reduce unwanted distortion components under the control of, for example, a microprocessor. Referring to FIG. 20, an amplification system 161 is illustrated which reduces out-of-band frequency components of an input signal over line 101 which after passing through Class A/B amplifier 102 has both in-band frequency components and out-of-band frequency components. The amplification system includes a feedfoward network 160 having a combiner 162 that receives a pair of signals: the first signal (FIG. 6A) over a line 161 from delay element 161a having the in-band frequency components and a second signal (FIG. 6B) over a line 163 coupled to the amplifier 102 output, that has both in-band and out-of-band frequency components. Optimally, the combiner 162 subtracts the first signal from the second signal to produce a signal having only out-of-band frequency components. A variable gain-phase network 164, 166 receives the output of the combiner 162 and applies its output to an error amplifier 168. Amplifier 168 amplifies the out-of-band frequency components. A second combiner 170 adds the output of amplifier 168 (that is, a signal having out-of-band distortion components shifted by 180°) to the signal having both out-of-band and in-band frequency components from a delay 169. Ideally, combiner 170 produces an amplified signal substantially free of out-of-band distortion components as is well known in the field.

However, as mentioned above, changes in the feedforward network 160 components and the amplifier 102, over time, can reduce the effectiveness of the feedforward network 160 in reducing distortion. Thus, the output of combiner 170 is coupled, in part, by a coupler 171 to a feedback loop having control system 104. The control system 104, described previously, detects energy in the out-of-band frequency components and produces a feedback control signal related to the measured energy in those out-of-band frequency components. The feedback control signals are coupled to and adjust, in this illustrated embodiment, the characteristics of the gain-phase network 164, 166 in accordance with out-of-band frequency components.

As noted above, a predistortion circuit, as illustrated in FIGS. 5 and 12, can be advantageously used to further reduce unwanted distortion components under the control of, for example, the microprocessor 122 of FIG. 20. In addition, regarding both the illustrative examples of FIGS. 19 and 20, the microprocessor 122 can be used to adjust bias parameters of a predistorter, main amplifier 102, gain-phase circuities or other devices to advantageously reduce distortions in the amplified output signal.

Figure 21:
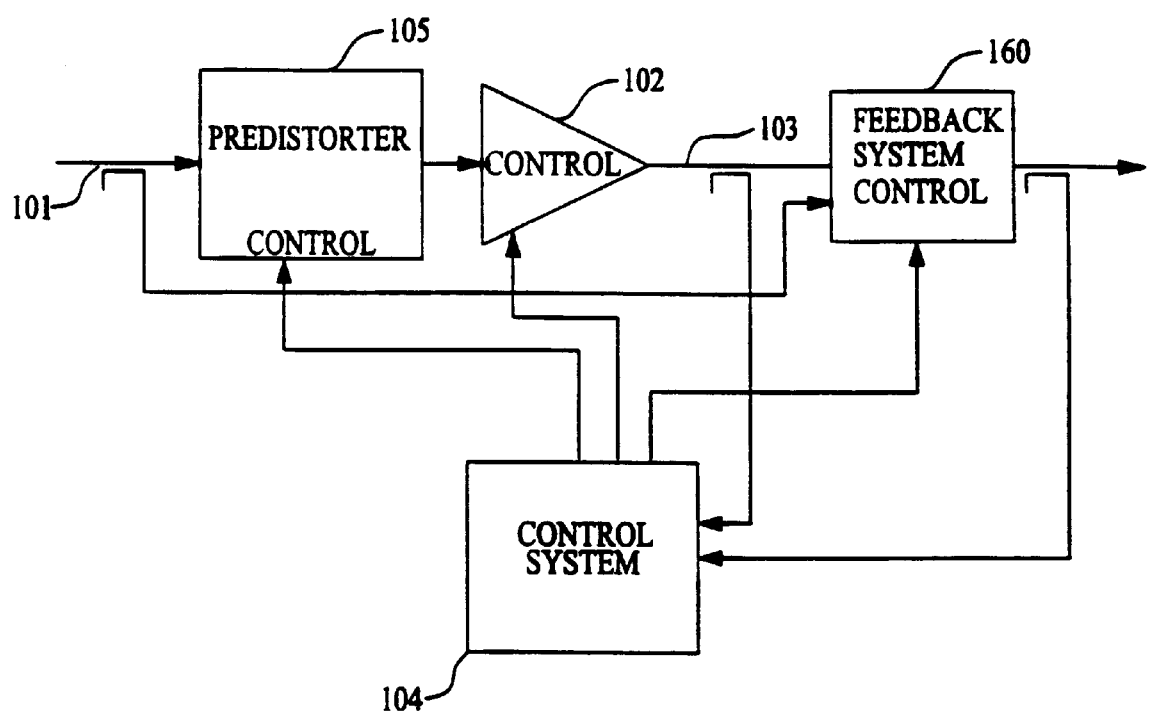
FIG. 21 is a diagrammatical sketch of an amplification system having a control system controlling multiple components according to the invention.

Referring now to FIG. 21, the control system 104 or 104' can control multiple components of an amplifier system to produce an overall reduced distortion amplified output signal. As shown, the control system 104 controls the predistorter 105, the bias point of the main amplifier 102, and the characteristics of the feedforward network 106. Thus, different individual amplification system networks (for example, the predistorter) combine to form a larger network (that is, predistorter and amplifier and feedforward network) having adjustable characteristics adjustably controlled by the control system in response to detected energy in the out-of-band frequency components.

Throughout this discussion it has been implicitly assumed that the input signal on line 101 was a single channel, bandwidth limited signal having a carrier frequency which was not known in advance. The distortion compensation circuitry described in connection, for example, with FIGS. 7 and 20, can also be employed when the input signal is a multi-channel signal, each channel having a bandwidth limited signal. When used with multi-channel inputs, the compensation system finds one channel, and minimizes the out-of-band frequency components for that channel as if the other channel(s) did not exist. Thereafter, the settings used for the one channel are used for all of the channels.

Thus the operative structure and method of operation of the FIGS. 7 and 20 embodiments remain the same. It further appears not to matter which channel was minimized so that the frequency generator 126 search pattern, established by microprocessor 124 can be the same as for a single channel, that is, for example, can be a linear or a random sweep.

Additions, subtractions, and other modifications of the disclosed embodiments will be apparent to those practiced in the field and are within the spirit and scope of the appended claims.

What is claimed is:

1. Apparatus for reducing out-of-band frequency components of an RF signal having a carrier frequency which is not known in advance, and having both in-band frequency components and the out-of-band frequency components, such apparatus comprising:

a network for amplifying an input signal for producing said RF signal, said network having adjustable electrical bias parameters; and a control system connected to the network for locating a frequency within the bandwidth of the amplified RF signal and using said located frequency as an effective center frequency for detecting energy in the out-of-band frequency components for producing a control signal related to the energy in the out-of-band frequency components, such control signal being coupled to the network to adjust the electrical bias parameters of the network and reduce the energy in the out-of-band frequencies.

2. The apparatus of claim 1, wherein the network comprises a predistorter having adjustable bias parameters controlled by the control signal.

3. The apparatus of claim 1, wherein the network comprises an amplifier having adjustable bias parameters controlled by the control signal.

4. The apparatus of claim 3, wherein the amplifier is a MOSFET amplifier.

5. The apparatus of claim 1, wherein the network comprises a feedforward network.

6. The apparatus of claim 1, wherein the signal comprises a CDMA signal.

7. The apparatus of claim 1, further comprising a second network having adjustable bias parameters, the bias parameters of the second network also being controlled by the control system.

8. The apparatus of claim 1, wherein the control system comprises a digital signal processor.

9. A method of reducing out-of-band frequency components introduced into an RF signal, having in-band frequency components, having a carrier frequency not known in advance, by a signal processing network with adjustable bias parameters, the method comprising:

locating an in-band frequency component of the unknown carrier frequency RF signal, detecting energy at frequencies at a predetermined offset from the located in-band frequency component of the located carrier signal; and adjusting network bias parameters to reduce the out-of-band frequency energy.

10. The method of claim 9, wherein locating the in-band frequency component comprises:

measuring the energy at a first frequency;

measuring the energy at a second frequency; and determining whether the energy measured at the second frequency exceeds the energy measured at the first frequency by more than a threshold.

11. The method of claim 9, further comprising heterodyning the signal having out-of-band frequency energy.

12. Apparatus for reducing distortion components introduced into an input signal by passing such signal through an amplifier operating with a non-linear output signal versus input signal transfer characteristic, such signal having a bandwidth centered about a carrier frequency not known in advance, such distortion components being at frequencies outside the bandwidth, the apparatus comprising:

(A) a predistorter, connected to receive the input signal and having an output coupled to the amplifier, such predistorter having a predistorter non-linear output signal versus input signal characteristic selectably adjustable by varying bias parameters of the predistorter in accordance with an out-of-band feedback control signal to provide a substantially linear amplifier output power versus input signal power transfer characteristic; and (B) a feedback loop comprising a control system connected to the amplifier output for locating the carrier frequency of the amplified input signal and using said located carrier frequency as an effective center frequency to define the bandwidth of the amplified input signal for producing a feedback control signal related to energy in the distortion frequency components outside the bandwidth of the amplified input signal, such feedback control signal being coupled to change bias parameters of the predistorter for adjusting electrical characteristics of the predistorter to reduce the energy in the out-of-band frequency components of the amplifier output.

13. Apparatus for reducing out-of-band frequency components of an amplified RF input signal, said amplified signal having both in-band frequency components and out-of-band frequency components, and said input signal having in-band frequency components introduced by a distortion producing power amplifier, such apparatus comprising:

(A) a feedforward network, comprising:

(i) a first combiner coupled to the input signal and the amplified signal;

(ii) a variable gain-phase network controlled by first and second control signals; and (iii) an error amplifier connected to the output of the variable gain-phase network, the error amplifier amplifying the output of the network and the amplified output being delivered to a second combiner the second combiner receiving as a second input a delayed version of the amplified signal; and (B) a feedback loop coupled to the output of the second combiner for adjusting bias parameters of the apparatus in accordance with the out-of-band frequency components in the amplified signal, to reduce said out-of-band frequency components said loop determining said out-of-band frequency components based upon a carrier frequency of said input signal.

14. The apparatus of claim 13, wherein the input signal comprises a CDMA signal.

* * * * *